(12) United States Patent
Gdor et al.

(10) Patent No.: US 12,105,414 B2
(45) Date of Patent: Oct. 1, 2024

(54) TARGETS FOR DIFFRACTION-BASED OVERLAY ERROR METROLOGY

(71) Applicant: KLA Corporation, Milpitas, CA (US)

(72) Inventors: Itay Gdor, Halevi (IL); Yuval Lubashevsky, Haifa (IL); Daria Negri, Nesher (IL); Eitan Hajaj, Ashqelon (IL); Vladimir Levinski, Migdal HaEmek (IL)

(73) Assignee: KLA Corporation, Milpitas, CA (US)

( * ) Notice: Subject to any disclaimer, the term of this patent is extended or adjusted under 35 U.S.C. 154(b) by 86 days.

(21) Appl. No.: 17/923,471

(22) PCT Filed: Oct. 6, 2022

(86) PCT No.: PCT/US2022/045832
§ 371 (c)(1),
(2) Date: Nov. 4, 2022

(87) PCT Pub. No.: WO2023/096704
PCT Pub. Date: Jun. 1, 2023

(65) Prior Publication Data
US 2024/0118606 A1 Apr. 11, 2024

Related U.S. Application Data

(60) Provisional application No. 63/283,429, filed on Nov. 27, 2021.

(51) Int. Cl.
*G03F 1/44* (2012.01)
*G03F 7/00* (2006.01)
*H01L 21/66* (2006.01)

(52) U.S. Cl.
CPC ............ *G03F 1/44* (2013.01); *G03F 7/70633* (2013.01); *G03F 7/70683* (2013.01); *H01L 22/12* (2013.01)

(58) Field of Classification Search
CPC .... G03F 1/44; G03F 7/70616; G03F 7/70683; G03F 7/70633; H01L 22/12; H01L 22/30;
(Continued)

(56) References Cited

U.S. PATENT DOCUMENTS

| 7,317,824 | B2 * | 1/2008 | Ghinovker | ................ G06T 7/33 382/145 |
| 7,480,892 | B2 * | 1/2009 | Chiu | .................... G03F 7/70683 716/50 |

(Continued)

FOREIGN PATENT DOCUMENTS

WO 2021236470 A1 11/2021

OTHER PUBLICATIONS

WIPO, International Search Report for International Application No. PCT/US2022/045832, Feb. 8, 2023.
(Continued)

*Primary Examiner* — Michael M Trinh
(74) *Attorney, Agent, or Firm* — Hodgson Russ LLP (57) ABSTRACT

A method for semiconductor metrology includes depositing first and second overlying film layers on a semiconductor substrate and patterning the layers to define an overlay target. The target includes a first grating pattern in the first layer, including at least a first linear grating oriented in a first direction and at least a second linear grating oriented in a second direction perpendicular to the first direction, and a second grating pattern in the second layer, including at least a third linear grating identical to the first linear grating and a fourth linear grating identical to the second linear grating. The second grating pattern has a nominal offset relative to the first grating pattern by first and second displacements in the first and second directions, respectively. A scatterometric
(Continued)

image of the substrate is captured and processed to estimate an overlay error between the patterning of the first and second layers.

16 Claims, 4 Drawing Sheets

(58) Field of Classification Search
CPC ....... H01L 22/20; H01L 22/34; H01L 23/544; H01L 21/682
See application file for complete search history.

(56) References Cited

U.S. PATENT DOCUMENTS

| | | | |
|---|---|---|---|
| 8,330,281 B2* | 12/2012 | Ghinovker | ................ G06T 7/33 |
| | | | 257/E23.179 |
| 10,095,122 B1 | 10/2018 | Lee et al. | |
| 10,890,436 B2* | 1/2021 | Amir | .................... G03F 7/70633 |
| 11,726,410 B2* | 8/2023 | Hajaj | ...................... H01L 22/12 |
| | | | 356/401 |
| 2004/0233444 A1 | 11/2004 | Mieher et al. | |
| 2005/0012928 A1* | 1/2005 | Sezginer | ................ G01B 11/26 |
| | | | 356/401 |
| 2012/0033215 A1* | 2/2012 | Kandel | ............... G03F 7/70633 |
| | | | 356/366 |
| 2016/0313658 A1 | 10/2016 | Marciano et al. | |
| 2017/0153558 A1 | 6/2017 | Tel et al. | |
| 2019/0250521 A1* | 8/2019 | Amit | ...................... G01N 21/47 |

OTHER PUBLICATIONS

WIPO, Written Opinion of the International Searching Authority for International Application No. PCT/US2022/045832, Feb. 8, 2023.
Adel et al., "Diffraction order control in overlay metrology: a review of the roadmap options," Proc. SPIE, 2008, vol. 6922, Metrology, Inspection, and Process Control for Microlithography XXII, 692202.

* cited by examiner

TARGETS FOR DIFFRACTION-BASED OVERLAY ERROR METROLOGY

CROSS-REFERENCE TO RELATED APPLICATION

This application claims the benefit of U.S. Provisional Patent Application 63/283,429, filed Nov. 27, 2021, which is incorporated herein by reference.

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In photolithography, a thin layer of a photosensitive polymer (photoresist) is deposited over a semiconductor substrate and patterned using optical or other radiation, leaving parts of the substrate covered by the photoresist. The photoresist is patterned by a scanner projecting an image of a reticle onto the photoresist, typically using ultraviolet radiation. After patterning, the substrate is modified by methods such as etching and ion bombardment to change the material properties and/or the topography of the substrate, while the parts of the substrate covered by the photoresist are not affected.

Semiconductor circuit metrology is used for measuring properties of the patterned photoresist, such as the topography and location of the patterned features. Accurate location of the patterned features of the photoresist with respect to previously patterned process layers is crucial for achieving a high yield of the photolithographic process. Any error in the registration (misregistration) of the patterned photoresist with respect to an underlying process layer is referred to as "overlay error." As an example, in typical semiconductor circuits with minimum line-widths of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology apparatuses (commonly called optical overlay metrology tools), as optical radiation in the visible and infrared wavelengths is capable of penetrating through the photoresist layer, as well as through dielectric layers under the photoresist. Furthermore, infrared wavelengths are capable of penetrating a semiconductor substrate, such as silicon, enabling metrology through the substrate. The overlay error is measured using overlay targets located in the scribe lines of the semiconductor substrate (the lines separating adjacent dies) and/or within the dies.

Commonly used overlay metrology tools fall into two categories: scatterometry tools and imaging tools. Scatterometry tools, such as the ATL100™ tool by FLA Corporation (Milpitas, CA, USA), capture a diffracted (scatterometric) image of periodic target features of the overlay target from the exit pupil of the objective lens of the metrology tool. The scatterometric image, indicative of the angular distribution of the optical radiation that is scattered from the target features, is processed in order to measure the overlay error.

Imaging tools, such as the Archer™-series tools by KLA Corporation (Milpitas, CA, USA), capture an image of an overlay target, such as an AIM' overlay target by KLA. An image analysis algorithm is applied to the acquired images in order to locate the center of symmetry of the target features in the process layer and the center of symmetry of the target features in the photoresist layer. The overlay error is computed based on the displacement between the centers of symmetry of the target features in the two layers.

The terms "optical radiation" and "light," as used in the present description and in the claims, refer generally to any and all of visible, infrared, and ultraviolet radiation.

SUMMARY

Embodiments of the present invention that are described hereinbelow provide improved designs for overlay targets, particularly for use in scatterometry, as well as methods and systems for metrology using such overlay targets.

There is therefore provided, in accordance with an embodiment of the invention, a method for semiconductor metrology. The method includes depositing a first film layer on a semiconductor substrate and a second film layer overlying the first film layer and patterning the first and second film layers to define an overlay target. The overlay target includes a first grating pattern, which is formed in the first film layer and includes at least a first linear grating oriented in a first direction and at least a second linear grating oriented in a second direction perpendicular to the first direction. The overlay target also includes a second grating pattern, which is formed in the second film layer and includes at least a third linear grating that is identical to the first linear grating and a fourth linear grating that is identical to the second linear grating, the second grating pattern having a nominal offset relative to the first grating pattern by predetermined first and second displacements in the first and second directions. The method further includes capturing a scatterometric image, using an imaging assembly, of the semiconductor substrate on which the overlay target has been formed and processing the image to estimate an overlay error between the patterning of the first and second film layers.

In some embodiments, the first grating pattern further includes fifth and sixth linear gratings oriented respectively in the first and second directions, and the second grating pattern further includes seventh and eighth linear gratings oriented respectively in the first and second directions, and the third and fourth linear gratings are offset in a positive sense by the predetermined first and second displacements relative to the first and second linear gratings, while the seventh and eight linear gratings are offset in a negative sense by the predetermined first and second displacements relative to the fifth and sixth linear gratings.

In a disclosed embodiment, the first and second displacements have equal magnitudes.

Additionally or alternatively, each of the linear gratings includes at least two parallel bars having a predefined spacing between the bars in each of the linear gratings, and the first linear grating and the second linear grating are spaced apart by a distance that is equal to the predefined spacing between the bars.

In some embodiments, the first and second grating patterns have dimensions in a plane of the semiconductor substrate no greater than 10 µm×10 µm. Alternatively, the first and second grating patterns have dimensions in the plane of the semiconductor substrate no greater than 5 µm×5 µm.

In additional embodiments, the first film layer includes a process layer, and the second film layer includes a photoresist layer. Alternatively, each of the first and second film layers includes a process layer.

In some embodiments, capturing the scatterometric image includes focusing optical radiation scattered from the overlay target to an exit pupil of an objective lens, and imaging the exit pupil onto an image sensor. Additionally or alternatively, processing the image includes comparing two or more diffraction orders in the image in order to estimate the overlay error.

There is also provided, in accordance with an embodiment of the invention, a mask set for patterning a semiconductor wafer. The mask set includes a first photolithographic mask configured for patterning a first film layer on the semiconductor wafer, the first photolithographic mask including a first grating pattern, which includes at least a first linear grating oriented in a first direction and at least a second linear grating oriented in a second direction perpendicular to the first direction. The mask set further includes a second photolithographic mask configured for patterning a second film layer overlying the first film layer on the semiconductor wafer. The second photolithographic mask includes a second grating pattern, which is formed in the second film layer and includes at least a third linear grating that is identical to the first linear grating and a fourth linear grating that is identical to the second linear grating, the second grating pattern having a nominal offset relative to the first grating pattern by predetermined first and second displacements in the first and second directions, respectively.

The present invention will be more fully understood from the following detailed description of the embodiments thereof, taken together with the drawings in which:

DETAILED DESCRIPTION OF EMBODIMENTS

Overlay targets are commonly used for precise and accurate measurements of the overlay error between successive patterned film layers on a semiconductor substrate. These layers may comprise, for example, a process layer and a photoresist layer, or, in after-etch applications, two process layers. Thus, although some example embodiments are described below with reference to a process layer and a photoresist layer, the principles of these embodiments may be applied, mutatis mutandis, to a first process layer and a second process layer.

In standard scatterometric overlay metrology, the overlay targets comprise linear gratings formed of parallel, equispaced bars, oriented in two orthogonal directions in the plane of the semiconductor wafer, with sets of identical overlaid gratings in the photoresist layer and the process layer. The gratings in the photoresist layer are offset, by suitably offset mask features in the photolithographic process, with respect to the gratings in the process layer by predefined nominal displacements of a magnitude in, which are less than the grating spacing. The displacement of each linear grating is in a direction orthogonal to the grating bars. For each grating direction, some of the displacements are in a positive sense, and the others in a negative sense. These displacements break the symmetry between the gratings in the two layers and thus the symmetry between the +1 and −1 diffracted orders, and enable the extraction of the overlay error from the diffracted signals. The positive and negative signs of the displacements refer to suitably chosen coordinate axes, with an arbitrary choice of the positive and negative directions of the axes. Similarly, the choice of the sign of the diffracted orders is arbitrary.

A common design of a scatterometry overlay target comprises a square with four cells positioned as four quadrants of the square. Typical dimensions of such a target are 20 µm×20 µm, with four 5 µm×5 µm cells. Each cell comprises a linear grating in the process layer (process grating), and an identical linear grating in the photoresist layer (photoresist grating) overlaid on the process grating. In two of the cells, the bars of the linear gratings are oriented in the y-direction, and the photoresist grating is offset with respect to the process grating in the x-direction; while in the other two cells, the bars are oriented in the x-direction, and the photoresist grating is offset with respect to the process grating in the y-direction by a displacement $f_0$, and in the fourth cell the photoresist.

For this sort of scatterometry overlay target with such dimensions, optical crosstalk in the form of diffraction between the grating pair in one cell and the ends of the bars of the orthogonally oriented grating pair in the neighboring cell is negligible. However, with reduced target size, for example in targets designed to be inserted in the device area, the required overall dimensions of the target shrink down to 5 µm×5 µm, or even smaller. For such small targets, optical crosstalk between a grating pair and its orthogonal neighbor may introduce significant errors into the measurement results.

The embodiments described hereinbelow address the problem of optical crosstalk in small scatterometry targets by offsetting each of the gratings in the photoresist layer relative to those in the process layer in two directions, both perpendicular and parallel to the grating bars. Consequently, the ends of the bars are shifted along the long dimension of the bars. Thus, by choosing appropriately the directions and the signs of the displacements for each grating, the bar ends have the same offsets as the long edges of the neighboring grating bars. Additionally, the distance between the bar ends and the neighboring grating is designed to have the same spacing as the bar spacings of the neighboring grating. Thus, the bar ends will add a partial bar to the neighboring grating and will contribute in an advantageous way to the scatterometry signal rather than introduce errors.

In the disclosed examples, a method for semiconductor metrology comprises depositing a first film layer on a semiconductor substrate and a second film layer overlying the first film layer, and patterning the first and second film layers to define an overlay target. The overlay target comprises a first grating pattern, which is formed in the first film layer and comprises at least a first linear grating oriented in a first direction and at least a second linear grating oriented in a second direction perpendicular to the first direction. The overlay target further comprises a second grating pattern, which is formed in the second film layer, and comprises at least a third linear grating that is identical to the first linear grating and a fourth linear grating that is identical to the second linear grating. The second grating pattern has a nominal offset relative to the first grating pattern by predetermined first and second displacements in the first and second directions, respectively. (In the present description and in the claims, the term "nominal" refers to the dimensions and patterns that would be printed in an ideal lithographic process, in accordance with the design of the masks used to pattern the two film layers.)

The method further comprises capturing a scatterometric image, using an imaging assembly, of the semiconductor substrate on which the overlay target has been formed, and processing the image to estimate the overlay error between the patterning of the first and second film layers. Deviations of the scatterometric image from the image that would be obtained from the ideal process are indicative of the deviations of the actual offsets between the grating patterns in the target relative to the nominal offsets.

Figure 1:
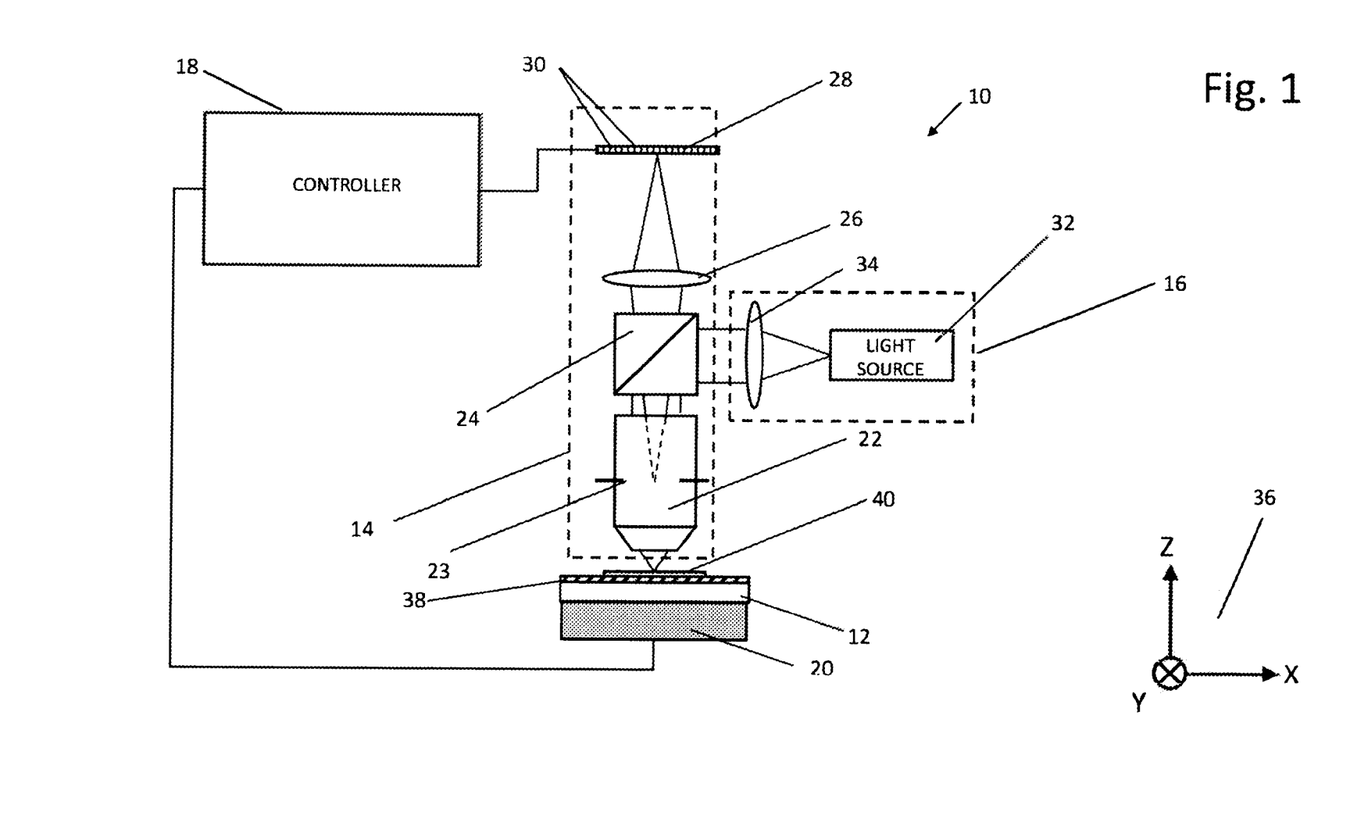
FIG. 1 is a schematic side view of scatterometric overlay metrology apparatus for measuring overlay error on a semiconductor wafer, in accordance with an embodiment of the invention.

FIG. 1 is a schematic side view of a scatterometric overlay metrology apparatus 10 for measuring overlay error on a semiconductor wafer 12, in accordance with an embodiment of the invention. Apparatus 10 is shown by way of example, to illustrate the use of the overlay targets that are described herein. Alternatively, such targets may be used in other sorts of scatterometric systems.

Scatterometric overlay metrology apparatus 10 comprises an imaging assembly 14, an illumination assembly 16, a controller 18, and a table 20 on which wafer 12 is mounted. Imaging assembly 14 comprises an objective lens 22 having an exit pupil 23, a cube beamsplitter 24, and an imaging lens 26. Imaging assembly 14 further comprises a two-dimensional sensor array 28, comprising for example, a complementary metal-oxide-semiconductor (CMOS) detector with a two-dimensional array of pixels 30. Imaging lens 26 images exit pupil 23 onto sensor array 28.

Illumination assembly 16 comprises a light source 32, emitting optical radiation, and a lens 34. Table 20 is located in proximity to objective lens 22, and comprises actuators, controlled by controller 18, which can move the table linearly in the x-, y-, and z-directions (with reference to Cartesian coordinates 36), as well as rotate the table around the z-axis.

In the pictured embodiment, a first film layer 38 has been deposited over semiconductor wafer 12 and patterned in a photolithographic process. In a subsequent process step, a second film layer 40, comprising photoresist, has been deposited over first film layer 38. In the present embodiment, first film layer 38 is referred to as a "process layer," and second film layer 40 is referred to as a "photoresist layer." In alternative embodiments, such as after-etch applications, both the first and second film layers may comprise process layers. Layers 38 and 40 comprise patterns formed by a photolithographic process, wherein semiconductor circuits are formed in wafer 12, including target features of scatterometric overlay targets, such as the overly target shown in FIG. 2 and described hereinbelow.

Controller 18 is coupled to sensor array 28 and to table 20. Controller 18 typically comprises a programmable processor, which is programmed in software and/or firmware to carry out the functions that are described herein, along with suitable digital and/or analog interfaces for connection to the other elements of apparatus 10. Alternatively or additionally, controller 18 comprises hard-wired and/or programmable hardware logic circuits, which carry out at least some of the functions of the controller. Although controller 18 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text.

To capture a scatterometric image of a scatterometry overlay target in film layers 38 and 40, wafer 12 is positioned on table 20 so that the target is in the field of view (FOV) of objective lens 22. Light source 32 projects a beam of coherent optical radiation to lens 34, which further projects the beam to cube beamsplitter 24. Beamsplitter 24 reflects the beam into objective lens 22, which projects the beam onto wafer 12. The radiation impinging on wafer 12 is scattered back to objective lens 22, with the angular distribution of the scattered radiation forming a scatterometric image in exit pupil 23. The scatterometric image is imaged by lens 26 onto sensor array 28. Controller 18 reads out the image and processes it in order to measure the overlay error.

Figure 2:
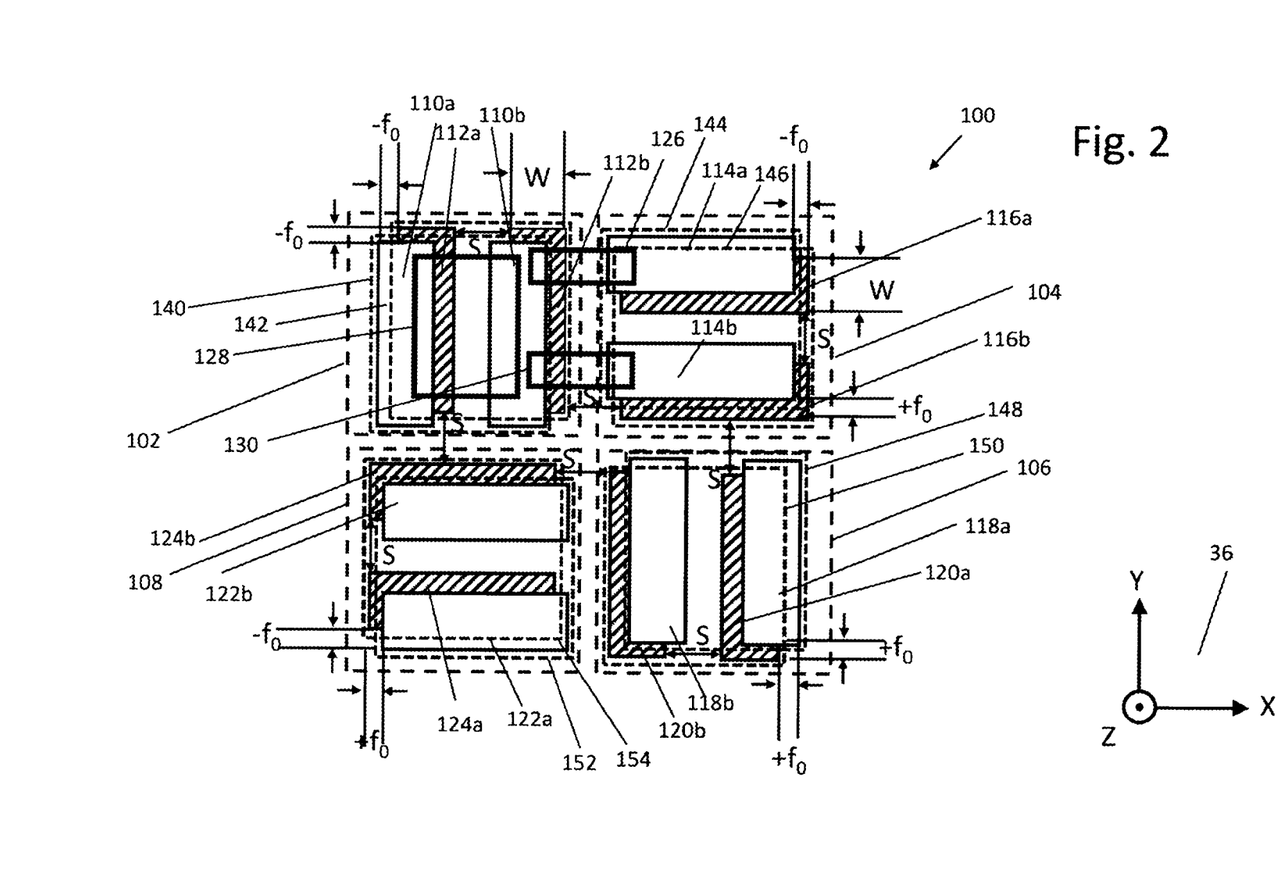
FIG. 2 is a schematic frontal view of an overlay target for scatterometry, in accordance with an embodiment of the invention.

FIG. 2 shows an overlay target 100 for use in scatterometric measurement of overlay errors, in accordance with an embodiment of the invention. Cartesian coordinates 36 are also shown in the present figure in order to clarify the orientation of overlay target 100 with respect to apparatus 10, as well as to facilitate the description of the target.

Target 100, viewed from the z-direction in the present figure, comprises four cells 102, 104, 106, and 108. Each cell comprises a linear grating formed in photoresist layer 40 (FIG. 1) overlaid on an identical linear grating formed in underlying process layer 38, with a nominal offset between the linear gratings in both the x- and y-directions. In the pictured example, each linear grating comprises two parallel bars, with the gratings and bars labeled as follows:

TABLE 1

LABELING OF THE GRATINGS AND BARS WITHIN THE CELLS

| Cell | Grating | Layer 40 (second grating pattern) | Layer 38 (first grating pattern) |
|---|---|---|---|
| 102 | 140 | 110a, 110b | |
|  | 142 |  | 112a, 112b |
| 104 | 144 | 114a, 114b | |
|  | 146 |  | 116a, 116b |
| 106 | 148 | 118a, 118b | |
|  | 150 |  | 120a, 120b |
| 108 | 152 | 122a, 122b | |
|  | 154 |  | 124a, 124b |

The first grating pattern of layer 38 and the second grating pattern of layer 40 are further detailed hereinbelow.

Although for the sake of simplicity, each of the linear gratings in FIG. 2 comprises only two bars, in practice each of the gratings formed in layers 38 and 40 will typically comprises a larger number of bars.

The two linear gratings within the cell are parallel to one another. Thus, for example, linear gratings 140 and 142 of cell 102 are parallel to each other. In the pictured example, the gratings in cells 102 and 106 are oriented in the v-direction, and the gratings in cells 104 and 108 are oriented in the x-direction. In all four cells, the bars in both the photoresist and process layers have the same nominal bar widths (critical dimensions, CD) of W, and bar-to-bar spacings of S.

Target 100 comprises a first grating pattern in layer 38 and a second grating pattern in layer 40. Taken together (Table 1), linear gratings 142, 146, 150 and 154 comprising bars 112a/b, 116a/b, 120a/b, and 124a/b, respectively, make up the first grating pattern, while linear gratings 140, 144, 148 and 152 comprising bars 110a/b, 114 a/b, 118 a/b and 122a/b, respectively, make up the second grating pattern. The second grating pattern has a nominal offset relative to the first grating pattern defined by displacements in both the x- and y-directions, as explained in further detail below. Although the grating patterns shown in FIG. 2 comprise four linear gratings in each of layers 38 and 40, in alternative embodiments overlay targets with these sorts of nominal offsets may comprise a smaller number of gratings, for example two gratings, or larger numbers of gratings. Furthermore, although the grating patterns shown in FIG. 2 conveniently have the same geometrical dimensions (including widths, spacings, and offsets) in both the x- and y-directions, in alternative embodiments, the dimensions in the x- and y-dimensions may be different.

Two aspects of target 100 are useful in mitigating the negative effects of optical crosstalk and improving the scatterometric images used for computing the overlay error: 1) the selected spacing between adjacent cells, and 2) the nominal offset between the bars in layers 38 and 40, which include displacements in each of the two x- and y-directions.

As noted earlier, the nominal offsets in the present description refer to offsets designed in the photolithographic process, wherein the offsets are implemented by suitable displacements of the features in the photolithographic masks used to generate the bars. The actual offsets of the bars in layer 40 relative to those in layer 38 are a sum of the nominal offsets and the overlay error. The nominal offsets are used to break the symmetry between the +1 and −1 diffracted orders of the scatterometry signals and thus enable controller 18 to process the scatterometric images to estimate the overlay error between layers 38 and 40.

With reference to cells 102 and 104, for example, the nominal spacing between the ends of bars 116a and 116b in layer 38 of cell 104 and the adjacent bar 112b in layer 38 of cell 102 is designed to have the same nominal spacing S as that between bars 112a and 112b. Similarly, with reference to cells 102 and 108, the nominal spacing between the ends of bars 112a and 112b in layer 38 of cell 102 and the adjacent bar 124b in layer 38 of cell 108 is designed to have the same nominal spacing S as that between bars 124a and 124b. Similar spacing is applied between the other two pairs of cells (cells 106 and 108 and cells 104 and 106.)

With further reference to cell 102, the nominal offset between bars 110a and 110b in layer 40 relative to bars 112a and 112b in layer 38 includes a displacement of $-f_0$ in the y-direction and a displacement of $-f_0$ in the x-direction. The displacement $f_0$ is typically a fraction of the bar width W. Here the negative senses of the displacements indicate that the displacements are in the negative direction of the coordinate axes of Cartesian coordinates 36. (The senses for "positive" and "negative" directions of the coordinate axes have been chosen arbitrarily.)

In cell 108, bars 122a and 122b have a nominal offset with respect to respective bars 124a and 124b including a displacement of $-f_0$ in the y-direction and a displacement of $+f_0$ in the x-direction.

The nominal offset of cell 106 comprises displacements in the opposite sense relative to cell 102, i.e., bars 118a and 118b are displaced by $+f_0$ in the positive directions of both the x- and y-axis relative to respective bars 120a and 120b.

Finally, the nominal offset of cell 104 comprises displacements in the opposite sense relative to cell 108, meaning displacements of bars 114a and 114b by $+f_0$ in the y-direction and by $-f_0$ in the x-direction relative to respective bars 116a and 116b.

Combining the spacing between the cells with the (two-dimensional) nominal offsets of the grating patterns has the effect that the ends of the bars in each cell have similar structures to the long sides of the bars in a neighboring cell. For example, the layer structure and spacing in an area 126, encompassing the ends of bar 116a and bar 114a in cell 104 with the facing long sides of bar 112b and bar 110b in cell 102, is the same as in an area 128, encompassing the facing long sides of bars 112a and 112b and of bars 110a and 110b in cell 102. Thus, the structure in area 126 contributes to the scatterometric image formed by the pairs of bars 110a/b and 112a/b in cell 102. A similar contribution is made by the ends of bar 116b and bar 114b in an area 130.

In overlay target 100, each of the cells 102, 104, 106, and 108 comprises two bars. As noted earlier, in alternative overlay targets, the cells may comprise a larger number of bars, such as three, four, five, or more bars. A larger number of bars increases the diffraction efficiency of target 100 and thus improves the quality of the scatterometric image imaged onto sensor array 28 (FIG. 1), but at the cost of a larger target size.

The pitch (period) P of the gratings, given by P=W+S, is selected so that the first diffraction orders (+1 and −1) of light diffracted from target 100 impinge within exit pupil 23 of objective lens 22 (FIG. 1). Depending on the numerical aperture (NA) of objective lens 22 and the spectrum of the coherent optical radiation emitted by light source 32, the pitch P may be chosen to be for example 500 nm, with a bar width W=250 nm and a bar spacing S=250 nm. Alternatively pitch P may be larger, such as 700 nm or 800 nm, corresponding, for gratings with equal bar width and spacing, to W=350 nm or 400 nm and S=350 nm or 400 nm, respectively. In alternative examples, unequal pitches and spacings may be chosen.

Depending on the number of bars within a cell and the pitch P of the bars, overlay targets in accordance with embodiments of the present invention may have outer dimensions in the plane of substrate 20 less than 10 μm×10 μm. By appropriate choice of the grating pitch, bar width, and number of bars, the overlay targets may be made as small as 5 μm×5 μm and still give good performance in scatterometric measurement of overlay error, or even down to 2 μm×2 μm or less when finer design rules are implemented.

Figure 3A:
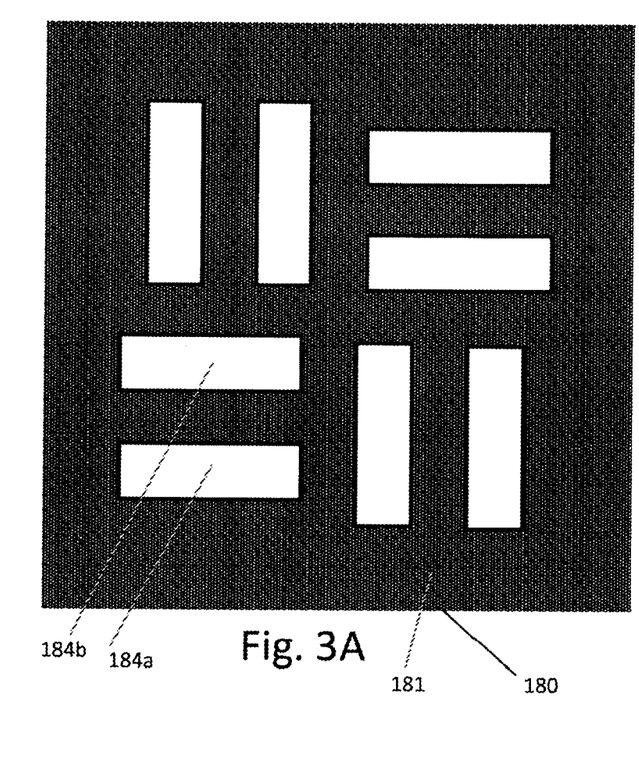
FIGS. 3A and 3B are schematic frontal views of a mask set comprising two photolithographic masks, in accordance with an embodiment of the invention.
Figure 3B:
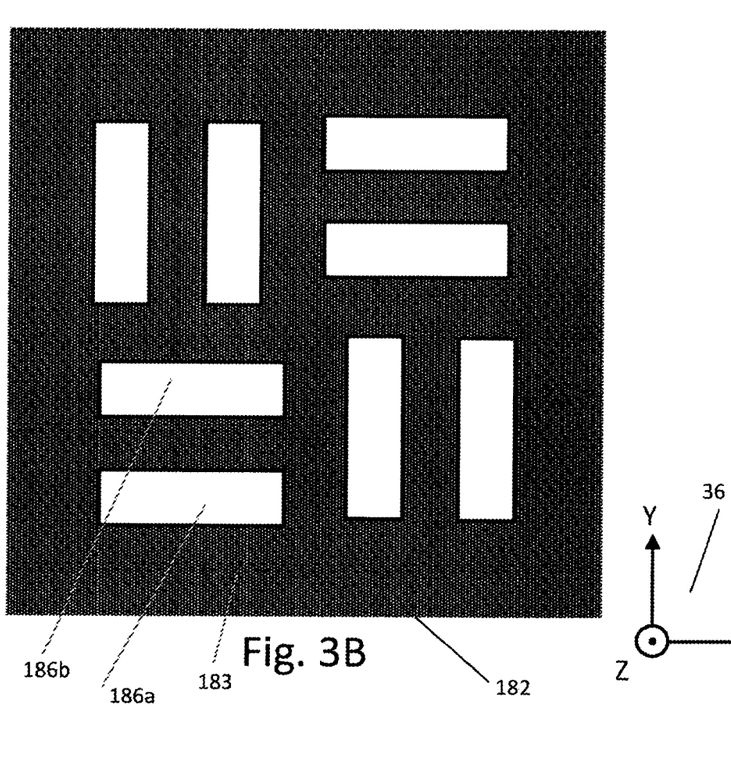

FIGS. 3A and 3B is a schematic frontal view of a mask set comprising photolithographic masks 180 and 182, which can be used in producing overlay target 100, in accordance with an embodiment of the invention. (In practice, such masks typically include a much larger set of device features, but for the sake of simplicity, FIGS. 3A and 3B show only the overlay target features.)

Photolithographic mask 180 comprises openings, such as openings 184a and 184b, in an opaque background 181, defining, in the photolithographic process, the first grating pattern on process layer 38. For example, openings 184a and 184b define, respectively, bars 124a and 124b (FIG. 2). Photolithographic mask 182 comprises openings, such as openings 186a and 186b, in an opaque background 183, defining the second grating pattern on photoresist layer 40. For example, openings 186a and 186b define, respectively, bars 122a and 122b (FIG. 2). The openings of mask 182 are shifted with respect to the openings of mask 180 in both the x- and y-directions so as to produce the desired nominal offset between the first and second grating patterns.

Alternatively, instead of uniform grating bars, each opening may comprise a set of multiple, closely-spaced parallel openings so that the corresponding multiple lines printed on semiconductor substrate 12 comply with the design rule of the photolithographic process. The set of multiple lines defines a bar in the overlay target, as the individual lines are typically unresolvable by the imaging assembly 14 of apparatus 10.

Figure 4:
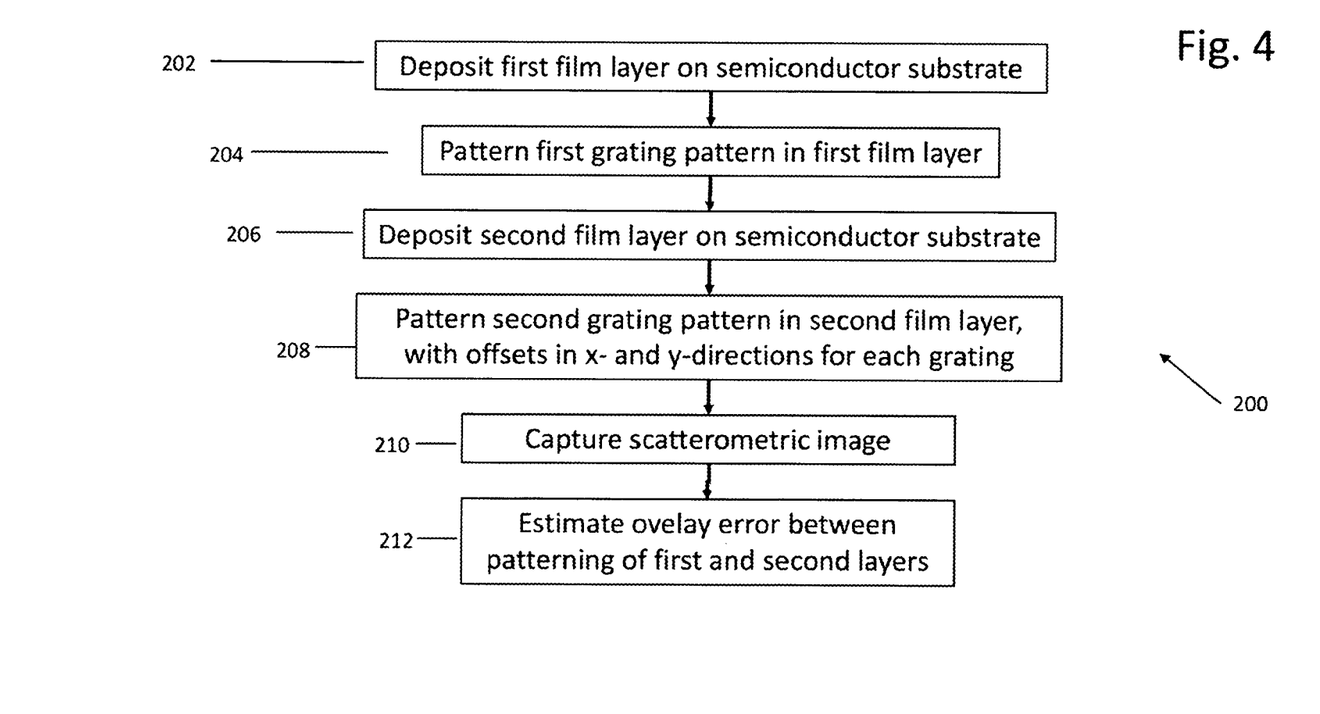
FIG. 4 is a flowchart that schematically illustrates a method for measurement of overlay error on a semiconductor wafer, in accordance with an embodiment of the invention.

FIG. 4 is a flowchart 200 that schematically illustrates the fabrication of an overlay target, such as target 100, and the measurement of overlay error using the target, in accordance with an embodiment of the invention.

In a first deposition step 202, a first film layer (for example process layer 38, as shown in FIG. 1) is deposited on semiconductor substrate 20. In a first patterning step 204, a first grating pattern is patterned in the first layer, for example by a process of photolithography using a first mask, followed by etching. In a second deposition step 206, a second film layer (for example photoresist layer 40) is deposited over the first layer. In a second patterning step 208, a second grating pattern is patterned in the second layer, for example using a second photolithographic mask, with predefined offsets in x- and y-directions for each grating of the grating pattern. The first and second grating patterns together constitute the overlay target.

After patterning of the first and second film layers in this manner, a scatterometric image is captured, for example by imaging assembly 14 of apparatus 10, in a scatterometric image capture step 210. In an overlay error estimation step 212, controller 18 of apparatus 10 processes the scatterometric image to estimate the overlay error between layers 38 and 40.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for semiconductor metrology, comprising:
    depositing a first film layer on a semiconductor substrate and a second film layer overlying the first film layer;
    patterning the first and second film layers to define an overlay target comprising:
        a first grating pattern, which is formed in the first film layer and comprises at least a first linear grating oriented in a first direction and at least a second linear grating oriented in a second direction perpendicular to the first direction; and
        a second grating pattern, which is formed in the second film layer and comprises at least a third linear grating that is identical to the first linear grating and a fourth linear grating that is identical to the second linear grating, the second grating pattern having a nominal offset relative to the first grating pattern by predetermined first and second displacements in the first and second directions, respectively;
    capturing a scatterometric image, using an imaging assembly, of the semiconductor substrate on which the overlay target has been formed; and
    processing the image to estimate an overlay error between the patterning of the first and second film layers.

2. The method according to claim 1, wherein the first grating pattern further comprises fifth and sixth linear gratings oriented respectively in the first and second directions, and the second grating pattern further comprises seventh and eighth linear gratings oriented respectively in the first and second directions, and
    wherein the third and fourth linear gratings are offset in a positive sense by the predetermined first and second displacements relative to the first and second linear gratings, while the seventh and eight linear gratings are offset in a negative sense by the predetermined first and second displacements relative to the fifth and sixth linear gratings.

3. The method according to claim 1, wherein the first and second displacements have equal magnitudes.

4. The method according to claim 1, wherein each of the linear gratings comprises at least two parallel bars having a predefined spacing between the bars in each of the linear gratings, and wherein the first linear grating and the second linear grating are spaced apart by a distance that is equal to the predefined spacing between the bars.

5. The method according to claim 1, wherein the first and second grating patterns have dimensions in a plane of the semiconductor substrate no greater than 10 µm×10 µm.

6. The method according to claim 5, wherein the first and second grating patterns have dimensions in the plane of the semiconductor substrate no greater than 5 µm×5 µm.

7. The method according to claim 1, wherein the first film layer comprises a process layer and the second film layer comprises a photoresist layer.

8. The method according to claim 1, wherein each of the first and second film layers comprises a process layer.

9. The method according to claim 1, wherein capturing the scatterometric image comprises focusing optical radiation scattered from the overlay target to an exit pupil of an objective lens, and imaging the exit pupil onto an image sensor.

10. The method according to claim 9, wherein processing the image comprises comparing two or more diffraction orders in the image in order to estimate the overlay error.

11. A mask set for patterning a semiconductor wafer, the mask set comprising:
    a first photolithographic mask configured for patterning a first film layer on the semiconductor wafer, the first photolithographic mask comprising a first grating pattern, which comprises at least a first linear grating oriented in a first direction and at least a second linear grating oriented in a second direction perpendicular to the first direction; and
    a second photolithographic mask configured for patterning a second film layer overlying the first film layer on the semiconductor wafer, the second photolithographic mask comprising a second grating pattern, which is formed in the second film layer and comprises at least a third linear grating that is identical to the first linear grating and a fourth linear grating that is identical to the second linear grating, the second grating pattern having a nominal offset relative to the first grating pattern by predetermined first and second displacements in the first and second directions, respectively.

12. The mask set according to claim 11, wherein the first grating pattern further comprises fifth and sixth linear gratings oriented respectively in the first and second directions, and the second grating pattern further comprises seventh and eighth linear gratings oriented respectively in the first and second directions, and
    wherein the third and fourth linear gratings are offset in a positive sense by the predetermined first and second displacements relative to the first and second linear gratings, while the seventh and eight linear gratings are offset in a negative sense by the predetermined first and second displacements relative to the fifth and sixth linear gratings.

13. The mask set according to claim 11, wherein the first and second displacements have equal magnitudes.

14. The mask set according to claim 11, wherein each of the linear gratings comprises at least two parallel bars having a predefined spacing between the bars in each of the linear gratings, and wherein the first linear grating and the second linear grating are spaced apart by a distance that is equal to the predefined spacing between the bars.

15. The mask set according to claim 11, wherein the first and second grating patterns have dimensions in a plane of the semiconductor substrate no greater than 10 μm×10 μm.

16. The mask set according to claim 15, wherein the first and second grating patterns have dimensions in the plane of the semiconductor substrate no greater than 5 μm×5 μm.

\* \* \* \* \*